US005297550A

United States Patent [19]
Margosian

[11] Patent Number: 5,297,550
[45] Date of Patent: Mar. 29, 1994

[54] BACKGROUND DARKENING OF MAGNETIC RESONANCE ANGIOGRAPHIC IMAGES

[75] Inventor: Paul M. Margosian, Lakewood, Ohio

[73] Assignee: Picker International, Inc., Highland Hts., Ohio

[21] Appl. No.: 925,993

[22] Filed: Aug. 6, 1992

[51] Int. Cl.⁵ ............................................. A61B 5/055
[52] U.S. Cl. ...................................... 128/653.2; 382/6; 382/54; 364/413.13
[58] Field of Search .......................... 128/653.2, 653.3; 382/6, 54; 364/413.13, 413.17, 413.19; 324/306, 309

[56] References Cited

U.S. PATENT DOCUMENTS

| | | | |
|---|---|---|---|
| 4,761,819 | 8/1988 | Denison et al. | 382/6 |
| 4,907,288 | 3/1990 | Shimoni | 382/54 |
| 4,991,092 | 2/1991 | Greensite | 364/413.13 |
| 5,067,163 | 11/1991 | Adachi | 382/6 |
| 5,113,865 | 5/1992 | Maeda et al. | 128/543.2 |
| 5,150,421 | 9/1992 | Morishita et al. | 382/6 |
| 5,166,876 | 11/1992 | Cline et al. | 364/413.13 |
| 5,170,443 | 12/1992 | Todd | 382/6 |
| 5,224,177 | 6/1993 | Doi et al. | 382/54 |

OTHER PUBLICATIONS

"Volume Neighborhood Criteria and Continuity Conditions for Improved Blood Vessel Conspicuity in MR Angiograms", Margosian, et al., SMRM Book of Abstracts, 1991, p. 200.
"Algorithms to Improve Conspicuity of Blood Vessels in MR Angiograms", Lakshminarayanan, et al., SMRM Book of Abstracts, 1991, p. 759.
"Application of a Connected-Voxel Algorithm to MR Angiographic Data", Saloner, et al., JMRI 1991; 1:423-430.
"Minimum Basis Set MR Subtraction Angiology" (MBS-MRA), Sattin, et al. SMRI '90 Eighth Annual Meeting Program and Abstracts, 446, p. 28.
"Statistical Segmentation and Region Growing Methods for Improving MR Angiograms", Margosian, SMRI '90 Eighth Annual Meeting Program and Abstracts, 249, p. 73.
"The Maximum Intensity Projection as a Segmentation Tool", Denison, et al., SMRI '90 Eighth Annual Meeting Program and Abstracts, 250, p. 73.
"The Hough Transform Applied to 3D MRA Data Sets", Wood, et al., SMRI '90 Eighth Annual Meeting Program and Abstracts, P084, p. 158.
"Three Dimensional Phase Contrast Angiography", Dumoulin, et al. SMRM Book of Abstracts, 1988, p. 725.
"3D MR Angiography Using Bipolar Gradient Echos", Laub, et al. SMRM Book of Abstracts, 1987, p. 52.
"3-D Representation of Vessels by Pixel Classification", Laub et al. SMRM Book of Abstracts, 1986, p. 508.
"SIMP: An Integrative Combination with MIP", Keller, et al. SMRM Book of Abstracts, 1986, p. 201.

Primary Examiner—Lee S. Cohen
Assistant Examiner—K. M. Pfaffle
Attorney, Agent, or Firm—Fay, Sharpe, Beall, Fagan, Minnich & McKee

[57] ABSTRACT

A magnetic resonance imaging system (A) examines a region of a patient and generates a plurality of views which are reconstructed (B) into a volumetric image representation and stored in a volume image memory (C). A ray projector (D) projects a plurality of rays (14) from a selectable viewing plane (10) into the volume data and retrieves a plurality of data values that lie along each ray. A maximum intensity projection system (E) selects the brightest pixel along each ray to become the corresponding pixel value of an uncorrected projection angiographic image which is stored in an image memory (F). The uncorrected angiographic image represents blood as bright or white values and non-blood tissues as dark or black values. Noise, some tissue types, regions with fine capillaries, and the like, cause the background non-blood regions of the image to appear hazy or gray rather than black. Each pixel value from the uncorrected angiographic image is processed by a transfer function (30) to generate corresponding pixel values of a background darkened angiographic image. The transfer function is linear (32) above a threshold brightness value (34) such that the bright or blood pixels have the same brightness in both the uncorrected and background darkened images. Pixels below the threshold (34) are lowered in brightness along a parabolic curve segment (36) such that the background appears darker.

20 Claims, 3 Drawing Sheets

BACKGROUND DARKENING OF MAGNETIC RESONANCE ANGIOGRAPHIC IMAGES

BACKGROUND OF THE INVENTION

The present invention relates to the diagnostic imaging arts. It finds particular application in conjunction with magnetic resonance angiography and will be described with particular reference thereto. However, the invention may find application in other imaging areas in which image values have a wide dynamic range and varying degrees of uncertainty associated with different pixel brightness levels.

In x-ray angiography, x-rays which pass through the patient are used to expose photographic film. One or more shadowgraphic or projection x-ray image is taken through a region of interest of the patient. In order to improve contrast between the patient's blood vessels and surrounding tissue, the patient is commonly injected with a contrast agent. The x-ray contrast agents commonly cause the patient's blood to attenuate the x-ray beam 200-300 times as much as comparable volumes of surrounding tissue. The resultant angiographic film image has a dark background where there are no blood vessels, and the blood vessels clearly delineated in white. There is a characteristic translucent appearance where blood vessels cross.

Analogous projection or shadowgraphic angiographic images can be created from magnetic resonance imaging. Most commonly, pixel values are determined for each pixel in a volumetric region defined by a plurality of parallel, planar magnetic resonance images. A viewing plane is defined outside of the volume orthogonal to a direction from which the radiologist wishes to view the material in the volume. The viewing direction is generally parallel to the direction that the x-ray beam would have been directed in x-ray angiography. The viewing plane is divided into pixels corresponding to pixels of a resultant video angiographic image and a ray is projected from each pixel orthogonal to the viewing plane (parallel to the viewing direction) into the volume. A value for each pixel of the image is derived from the brightness or voxel values of each voxel that the corresponding ray intersects as it passes through the volume region.

One difficulty with the magnetic resonance data is that the blood vessels are only 2 to 3 times as bright as the surrounding tissue. This small differentiation between the blood vessels and surrounding tissue causes the MR angiographic images to lack the definition and contrast characteristic of the x-ray angiographic images. The background tends to fade into gray tones. Of course, the blood vessels are not perfect tubes with a uniform brightness across. Rather, the blood vessels themselves have various gray scale shadings indicative of changes in contour, blockages, restrictions, and the like.

In one technique for imparting the visual image characteristics of an x-ray angiography image into a magnetic resonance angiography image, the pixel values along each projected ray are examined to find the pixel with the maximum intensity. This technique is often called the "Maximum Intensity Projection" or MIP technique. This causes the brightest object along each ray to be displayed on the resultant projection image at full intensity. This improved the brightness of the blood vessels. See Laub, et al., "3D MR Angiography Using Bipolar Gradient Echoes" SMRM Book of Abstracts, p. 52, 1987. The surrounding tissue also tends to become bright or more gray, reducing the blackness of the background.

By convention, the resultant angiographic image depicts the blood as bright or white, but not all the same brightness. Larger vessels tend to be brighter than smaller or thinner vessels. Background areas have a variety of gray scales. Some of the background areas are appropriately light gray due to the presence of blood flowing through very fine capillaries too small to be imaged as individual blood vessels. In other regions, light gray and even white spots are attributable to noise. The gray background problem compounds itself when the images are photographed on film to make a permanent record. The lack of contrast between the blood vessels and the background tissue renders film photography more difficult and produces photographic images which are more difficult to read and interpret.

Various techniques have been proposed for darkening the background. In one technique, the computer generated angiographic image is analyzed and a portion of the image which is clearly identifiable as blood is identified. The computer then, with pattern recognition and region growing techniques, attempts to follow the blood vessels through the imaged region. Once a complete mapping of the blood vessels is made, the remaining pixels can be set to black. One problem with pattern mapping or region growing approaches is that they are very computer intensive. Very large computers with very long computing times are required to process each image. Moreover, although they can follow large blood vessels quite accurately, the computer routines have difficulty with small blood vessels. The computer routines have difficulty deciding whether or not smaller blood vessels are in fact blood vessels. The computer tends to decide that many smaller blood vessels are not blood vessels and not follow them. The smaller blood vessels are then inappropriately set to black, causing a misrepresentation of what could be significant medical information.

In one particular implementation, the volumetric data are processed with a connected-voxel algorithm. A low signal intensity threshold is used to separate groups of voxels associated with different vessels from one another and to remove the contribution from low intensity stationary, non-blood material. The remaining voxels are grouped by a connectivity criterion into discrete objects. Vessels are represented by three-dimensional objects. Unconnected small objects were discarded as being noise and not part of the circulatory system. See "Application of Connected-Voxel Algorithm to MR Angiographic Data", Saloner, et al., JMRI, pp. 423-430, 1991. This technique is again very computer intensive, requiring long processing times and tends to lose or omit the smaller blood vessels.

In another technique, angiographic images are obtained by ray projection techniques from a plurality of directions. Each voxel of the volumetric image is thus examined from several directions, e.g. three. If the same spot represents blood in all images, then it is taken as blood. If not, it is taken as noise and deleted. See "The Maximum Intensity Projection As a Segmentation Tool", Denison, et al., SMRI Book of Abstracts, pg. 73, Abstract 250, 1990. Of course, in order to view the object from three or more directions, at least three times the computing time is required to generate the angiographic image.

In another technique, the image data is operated upon by a Hough transform. The Hough transform maps voxels belonging to a given curve to a single point. Through this mapping, bright pixels which are part of a blood vessel laying along a curve can be differentiated from bright pixels which are merely a random incidence of noise. See "The Hough Transform Applied to 3D MRA Data Sets", Wood, et al., SMRI Book of Abstracts, page 158 Abstract PO84, 1990. However, this technique is again very computationally intensive, requiring long periods of time to process each image.

In accordance with the present invention, a new and improved technique is provided for generating angiographic images with a darkened background.

SUMMARY OF THE INVENTION

In accordance with the present invention, regions of the angiographic image are identified by the probability with which they represent non-blood tissue. The intensity or brightness of pixels in the region identified as having a high probability of representing non-blood tissue are reduced non-linearly, but not zeroed.

In accordance with a more limited aspect of the present invention, the pixel values in the non-blood region are suppressed along a parabolic curve.

In accordance with another aspect of the present invention, volumetric magnetic resonance image data is collected. Rays are projected from a selected image plane into the volumetric region. Pixel values of the volumetric region intersected by each ray are processed with a maximum intensity projection technique to produce a corresponding pixel value or brightness for the angiographic image representation. Pixel values below a preselected threshold are reduced along a parabolic curve in accordance with their distance below the threshold.

One advantage of the present invention is that it is applied very quickly. Generally, the processing time is so short that it is not perceptible to the human operator.

Another advantage of the present invention resides in its simplicity.

Another advantage of the present invention is that it is supplied after the projection image is generated. This permits the operator to view the image corrected and uncorrected to assure that no medically significant information is suppressed.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
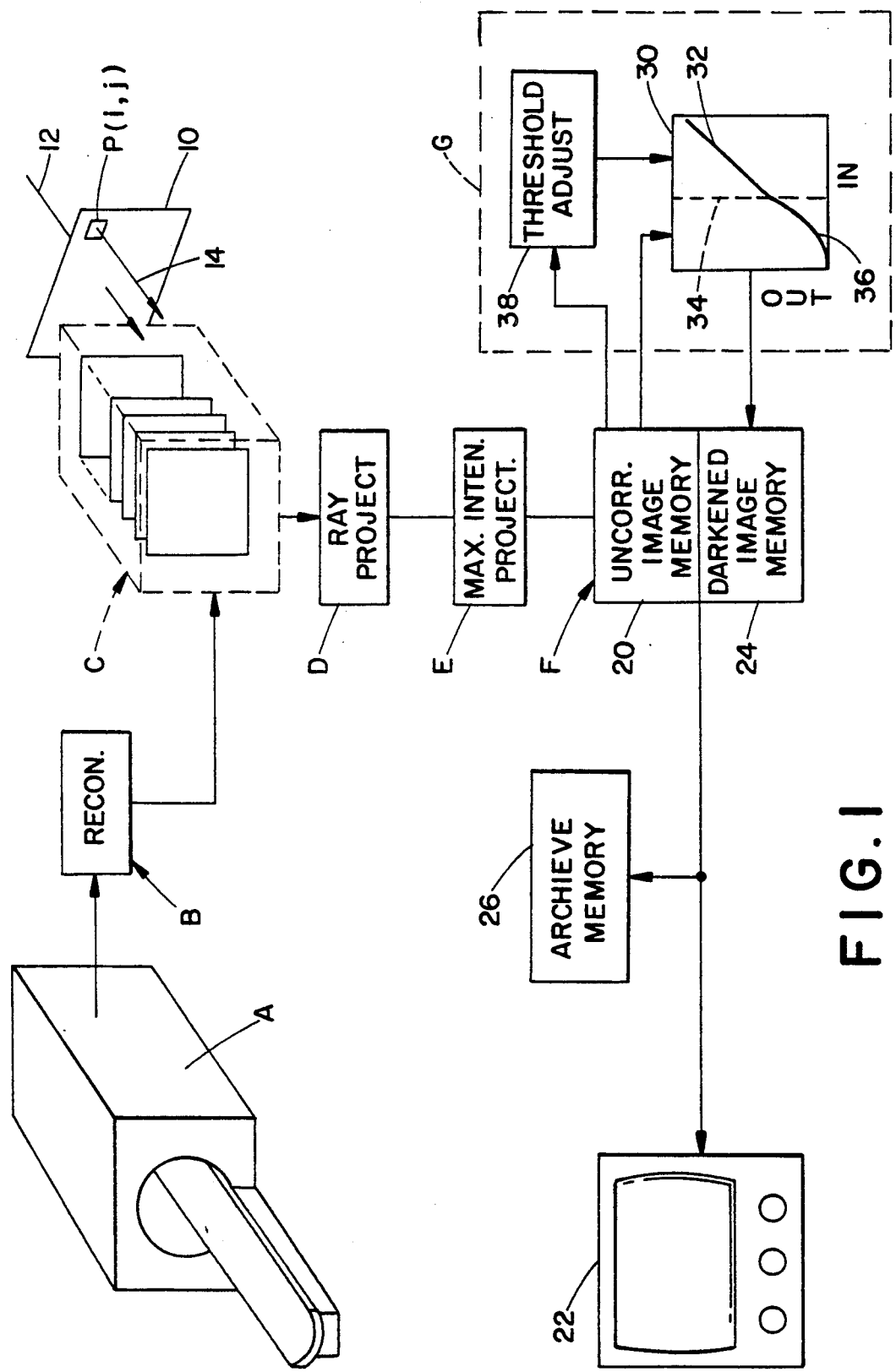
FIG. 1 is a diagrammatic illustration of a magnetic resonance angiographic system in accordance with the present invention.

A magnetic resonance medical diagnostic scanner or other source of image data A generates raw data sets or views. More specifically to the preferred embodiment, the magnetic resonance scanner subjects a portion of the subject in an examination region to a strong uniform magnetic field. Magnetic field gradient pulses and RF pulses are applied to excite dipoles in the examination region to resonance and to encode such resonance spatially. The resultant resonance signals are received and digitized to form the views. An image reconstruction means B reconstructs the views into a multi-dimensional image representation. In the preferred, magnetic resonance embodiment, the reconstruction means uses an inverse Fourier transform algorithm. The image representation includes a multiplicity of voxel gray scale or brightness values, each of which corresponds to one of a multiplicity of voxels arranged in a three-dimensional rectangular array. The voxels, each of which are the same size, each have a corresponding voxel value $V(x,y,z)$ indicative of a magnetic resonance property of a corresponding volumetric region of the subject. The voxel values corresponding to each voxel are stored in a volume memory means C.

Each voxel brightness value $V(x,y,z)$ is retrievable by addressing the volume memory means C with corresponding orthogonal addresses $(x,y,z)$. A ray projection or shadowgraphic image generating means D generates a two-dimensional projection image representation from all or a portion of the volumetric data in the memory means C. The projection image represents a projection of the volume data onto a two-dimensional viewing plane 10 which is transverse to a selectable viewing direction 12. In the preferred embodiment, the viewing plane 10 is divided into the pixels $P(i,j)$ of the projection image representation. A ray 14 is projected from each pixel $P(i,j)$ of the viewing plane parallel to the viewing direction 12, i.e. transverse to the viewing plane. The ray projection means D projects the ray 14 through the voxels and identifies which voxels $V(x,y,z)$ the ray intersects. The voxel values $V(x,y,z)$ corresponding to each intersected voxel are read to produce a series or vector of voxel values $V_1, V_2, V_3, \ldots, V_n$ corresponding to each ray. Various averaging or weighting of voxel values may be used, as is known in the art, to compensate for whether the ray passes directly through a voxel, between two voxels, and the like.

An image enhancement means E, preferably a maximum intensity projection means, processes each vector from the ray projection means D to generate a single pixel or brightness value $P(i,j)$ for a resultant angiographic projection image. In the preferred maximum intensity projection embodiment, the image enhancement means E examines each voxel or brightness value of the ray vector to find the brightest or highest intensity voxel value. This brightest voxel value is passed as the corresponding pixel $P(i,j)$ of the projection angiographic image. The pixel values of the projection angiographic image are stored in an angiographic projection image memory means F. More specifically to the preferred embodiment, each pixel or brightness value is stored in an original or unimproved image memory portion 20. A video monitor 22 is connected with the image memory means F for selectively displaying images stored therein. Preferably, the image memory means F can store a large plurality of image representations.

An image background darkening means G, in accordance with the present invention, selectively processes images from the unimproved image portion 20 of the image memory means F to darken their background. Having darkened the background, the image background darkening means G returns the darkened background images representation to a darkened background image storage portion 24 of the image memory. These images are likewise displayable on the video monitor 22, storable in an archive memory means 26, such as tape or disk, or the like.

The background darkening means G includes a transfer function means, such as a look up table 30 which is preprogrammed with a preselected transfer function. The transfer function is linear in a region 32 above a threshold point 34. Below the threshold point 34, the transfer function reduces the input amplitude along a parabolic function 36. A threshold adjusting means 38 selectively adjusts the threshold 34 in accordance with brightness distribution of the unimproved image.

Figure 2:
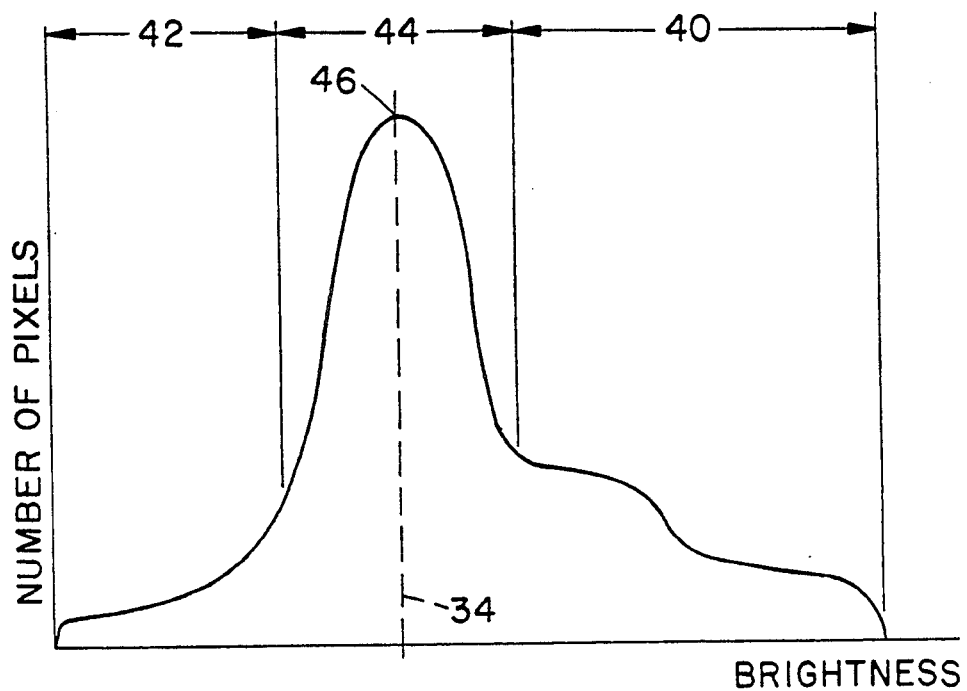
FIG. 2 is a histogram of a typical angiographic projection image.

With reference to FIG. 2, the threshold adjusting means 38 examines the image representation in the unimproved image memory portion 20. The pixels in the image memory portion 20 have a histogram or brightness versus number of pixels with each brightness curve which is typically similar to that shown in FIG. 2. The brightest pixels in a region 40 represent blood. The darkest pixels in region 42 represent non-blood tissue. There is a greater uncertainty regarding whether the pixels in region 44 represent some types of non-blood tissue, part blood and part non-blood tissue, tissue with capillaries smaller than the resolution of the image, or the like. By developing a histogram as illustrated in FIG. 2, a peak value 46 of the uncertain region 44 is readily determined. The lines of demarcation between region 44 and regions 40 and 42 can be calculated by the amount of deviation from the peak 46. The threshold 34 is adjusted in accordance with the peak value 46, preferably is the peak value 46.

Figure 3:
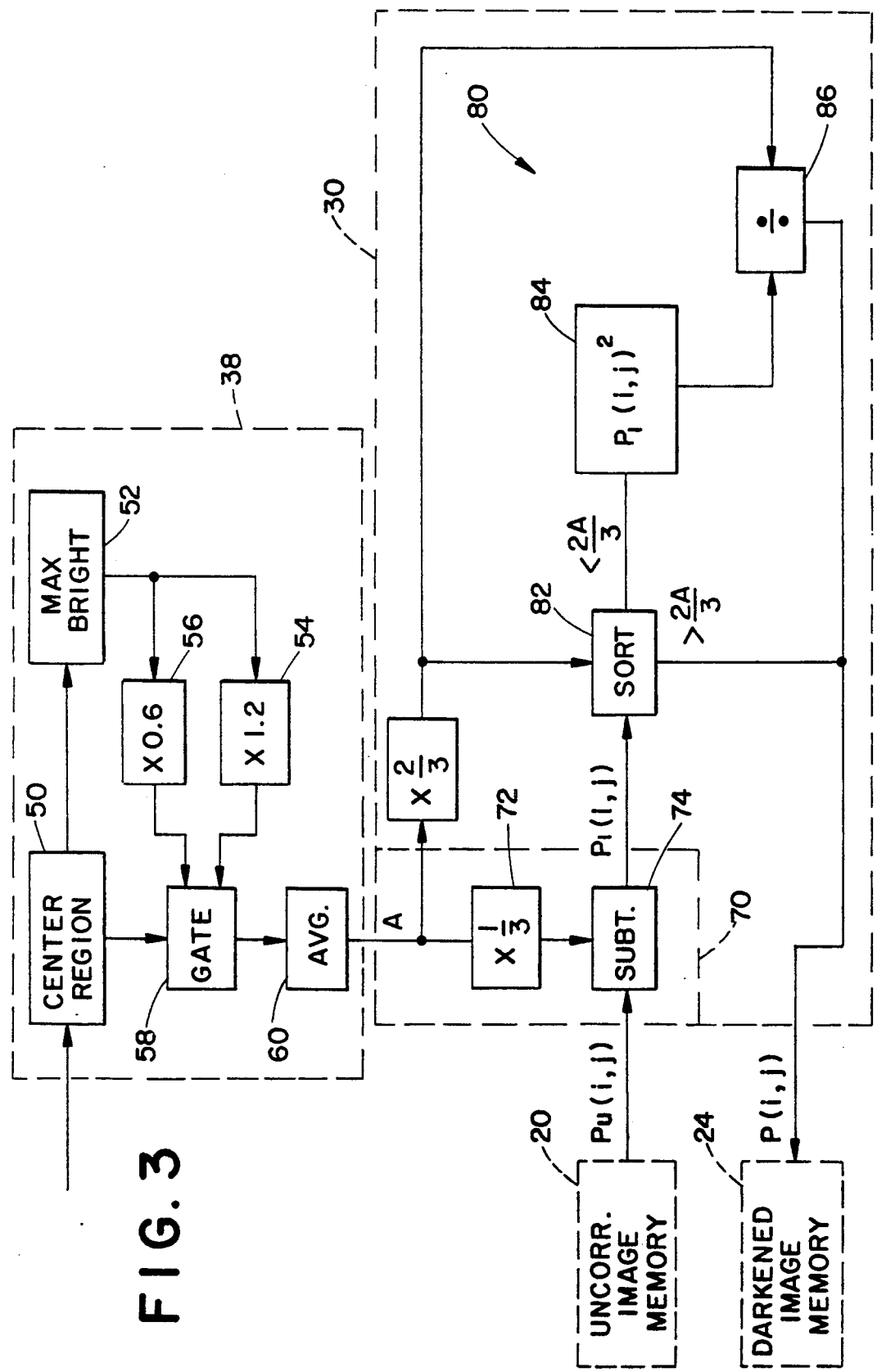
FIG. 3 is an exemplary processing circuit for reprocessing the projection image in accordance with the present invention; and, FIG. 4 illustrates an alternate embodiment of the transfer function.

With reference to FIG. 3, the threshold adjusting means 38 includes a means 50 for defining a central or other characteristic region of each image. Rather than process all pixels of the image, it has been found that by taking a central subregion, e.g., a 64×64 subregion, a satisfactory threshold value A or estimate of peak 46 can be calculated more quickly. A maximum brightness determining means 52 determines the maximum brightness of any pixel in the selected region. Multiplying means 54 and 56 multiply the maximum brightness by 20% and 60%, respectively. These values, it has been found, provide a good approximation of the regions 40 and 42. A gating means 58 passes each pixel value of the selected subregion which is in region 44 and discards those in region 42, i.e. below 20% of the maximum, and those in region 40, i.e. those above 60% of the maximum. An averaging means 60 averages the passed pixels, i.e. the pixels in region 44. This average or median A is an excellent approximation of the peak 46.

The transfer function means 30 in the embodiment of FIG. 3 is an active circuit, rather than a look up table. A first pixel brightness adjustment means 70 reduces the magnitude of each pixel linearly. More specifically, a dividing means 72 divides the average value A by 3. A subtracting means 74 subtracts the constant A/3 from each pixel value $P_u(i,j)$ of the unimproved image to provide a first order corrected pixel value $P_1(i,j)$.

A parabolic transfer function means 80 operates on each pixel value below the threshold A with a parabolic transfer function. A sorting means 82 sorts the pixel values $P_1(i,j)$ in accordance with whether the original pixel value $P_u(i,j)$ is greater than or less than A, i.e. whether $P_1(i,j)$ is greater than or less than 2A/3. If the pixel value is greater than the threshold, then the pixel value becomes the output pixel value $P(i,j)$ without further processing. If the pixel value $P_u(i,j)$ is less than the threshold A, then a exponent means 84 squares the first order corrected pixel value $P_1(i,j)$. A normalizing means 86 divides each squared pixel value by the threshold, normalizing the pixel values. Where A/3 was subtracted from the original pixel value $P_u(i,j)$, the threshold is now 2A/3. The output of the dividing means 86 is the corrected or normalized pixel value $P(i,j)$.

Various other alternate embodiments may also be used. For example, one can derive a coarse histogram by binning the pixel values into a limited number of groups, e.g. ten, for analysis. From the binned histogram, one can derive the threshold value with good precision.

Figure 4:
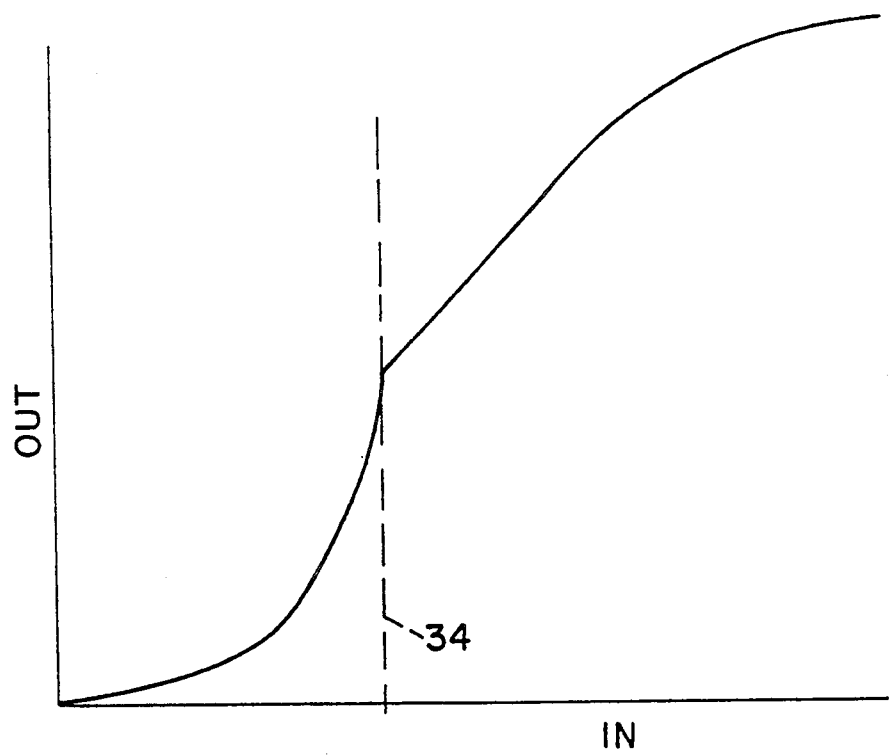

With reference to FIG. 4, other transfer functions may also be selected. For example, the transfer function need not be linear above the threshold. Rather, the top of the transfer function near the brightest pixel values can be non-linear to suppress the upper brightness range. By limiting the dynamic range of the brightest pixel values, photographing of the resultant image with a film camera is simplified.

In another alternate embodiment, the volume image is a series of planar images. A maximum intensity projection routine is performed on the volume data in volume memory C from which a crude histogram analysis can be performed. The voxel values within each slice of the volume image are operated upon by the non-linear transfer function algorithm using the threshold generated by the crude histogram analysis. Having performed a background darkening correction on the voxel values, the projection images can be generated from the volume data using conventional projection imaging techniques, such as the maximum intensity projection technique discussed above. As yet a further alternate embodiment, the projection images generated from the background darkened volumetric image data can again have its dark background darkened using the above-described background darkening techniques of FIGS. 1 and 3.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance apparatus for producing a projection angiographic image representation, the apparatus comprising:
   a magnetic resonance means for subjecting a subject in an examination region to magnetic field gradient and radio frequency signals, receiving magnetic resonance signals therefrom and producing a series of corresponding electronic views;

an image reconstruction means for reconstructing a plurality of the views from the magnetic resonance means into a volumetric image representation;

a ray projecting means for projecting a plurality of rays orthogonal to a selected viewing plane through the volumetric image representation and retrieving a series of volumetric data values corresponding to each ray;

a means for converting each series of volumetric data values into a pixel value of an uncorrected projection angiographic image representation;

a transfer function means for operating on the pixel values of the uncorrected projection angiographic image representation with a non-linear transfer function which reduces pixel values corresponding to a brightness below a threshold brightness value such that the reduced pixel values are displayed darker in a corrected angiographic projection image representation;

an image memory means for storing at least the corrected angiographic image representation.

2. The apparatus as set forth in claim 1 wherein the transfer function means includes a means for reducing the pixel values below the threshold brightness value along and in accordance with a parabolic curve.

3. The apparatus as set forth in claim 2 further including a means for adjusting the threshold brightness value of the transfer function means.

4. The apparatus as set forth in claim 3 wherein the transfer function means uses a linear transfer function above the threshold value.

5. The apparatus as set forth in claim 3 wherein the transfer function means suppresses pixel values near a greatest brightness to reduce a dynamic range of brightest pixel values to simplify film photography of the corrected angiographic projection image representation.

6. The apparatus as set forth in claim 3 wherein the threshold adjusting means includes:

a means for discarding pixel values from the uncorrected angiographic image representation which have a brightness in a first preselected region clearly indicative of blood and pixel values in a second preselected brightness region which have a brightness value clearly indicative of non-blood tissue;

a means for averaging pixel values within a region between the first and second regions to produce an average, the average being said brightness threshold value.

7. The apparatus as set forth in claim 6 wherein the transfer function means includes:

a sorting means for sorting pixel values of the uncorrected angiographic projection image representation to separate pixel values which are below the brightness threshold value;

an exponent means for raising the pixel values below the brightness threshold value to an exponent;

a normalizing means for normalizing the pixel values raised to the exponent.

8. The apparatus as set forth in claim 1 wherein the transfer function means includes:

a sorting means for sorting pixel values of the uncorrected angiographic projection image representation to separate pixel values which are below the brightness threshold value;

an exponent means for raising each pixel value below the brightness threshold value to an exponent;

a normalizing means for normalizing the pixel value raised to the exponent.

9. The apparatus as set forth in claim 8 wherein the exponent means includes means for squaring the pixel values below the brightness threshold value.

10. The apparatus as set forth in claim 9 wherein the normalizing means includes means for dividing the squared pixel values by the brightness threshold value.

11. The apparatus as set forth in claim 9 further including a means for reducing each pixel value of the uncorrected angiographic projection image representation by a preselected fraction of the brightness threshold value.

12. An apparatus for darkening the background of an uncorrected electronic angiographic projection image representation, the apparatus comprising:

a means for retrieving each pixel value of the uncorrected electronic angiographic projection image representation and comparing each retrieved pixel value with a brightness threshold;

an exponent means for raising each pixel value below the threshold to a preselected power;

a normalizing means for normalizing the pixel values raised to the power, each pixel value from the normalizing means replacing the corresponding pixel value in a background darkened electronic angiographic projection image representation.

13. The apparatus as set forth in claim 12 further including a means for reducing each pixel value of the uncorrected image representation by a preselected fraction of the threshold.

14. The apparatus as set forth in claim 12 further including:

a means for separating pixel values from the uncorrected angiographic image representation which have a brightness in a first preselected region clearly indicative of blood and pixel values in a second preselected brightness region which have a brightness value clearly indicative of non-blood tissue;

a means for averaging pixel values within a region between the first and second regions to produce an average, the average being said threshold.

15. A magnetic resonance method for producing projection angiographic image representation, the method comprising:

subjecting a subject in an examination region to magnetic field gradient and radio frequency signals, receiving magnetic resonance signals therefrom, and producing a series of corresponding electronic views;

reconstructing a plurality of the views into a volumetric image representation;

projecting a plurality of rays from a selected viewing plane through the volumetric image representation and retrieving a series of volumetric data values corresponding to each ray;

converting each series of volumetric data values into a pixel value of an uncorrected projection angiographic image representation;

operating on the pixel values of the uncorrected projection angiographic image representation with a non-linear transfer function which reduces pixel values corresponding to a brightness below a threshold brightness value such that the reduced pixel values are displayed darker in a corrected angiographic projection image representation.

16. A method for darkening a background of an uncorrected electronic angiographic projection image representation, the apparatus comprising:
- retrieving each pixel value of the uncorrected electronic angiographic projection image representation;
- comparing each retrieved pixel value with a brightness threshold;
- raising each pixel value below the threshold to a preselected power;
- normalizing the pixel values raised to the power;
- forming a background darkened electronic angiographic projection image representation from the normalized pixel values raised to the power and the pixel values above the threshold.

17. The method as set forth in claim 16 wherein in the raising step each pixel value is raised to a power of 2, whereby the pixel values are squared.

18. The method as set forth in claim 17 wherein in the normalizing step the squared pixel value is divided by the threshold value.

19. The method as set forth in claim 16 further including reducing each uncorrected pixel value by a preselected fraction of the threshold.

20. The method as set forth in claim 16 further including:
- identifying pixel values from the uncorrected angiographic image representation which have a brightness in a first preselected brightness region clearly indicative of blood and pixel values in a second preselected brightness region which have a brightness value clearly indicative of non-blood tissue;
- averaging pixel values which correspond to a brightness within a region between the first and second preselected brightness regions to produce an average, the average being said threshold.

* * * * *